(12) United States Patent
Chen et al.

(10) Patent No.: US 6,232,161 B1
(45) Date of Patent: May 15, 2001

(54) METHOD FOR FORMING A DUMMY ACTIVE PATTERN

(75) Inventors: Coming Chen, Taoyuan Hsien; Water Lur, Taipei, both of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/211,087

(22) Filed: Dec. 15, 1998

(51) Int. Cl.$^7$ .................................................. H01L 21/8238
(52) U.S. Cl. ......................... 438/199; 438/129; 438/223
(58) Field of Search .................................. 438/199, 223, 438/129, 424, 427, 435, 598, 599

(56) References Cited

U.S. PATENT DOCUMENTS 5,885,856 * 3/1999 Gillbert et al. ...................... 438/129
5,902,752 * 5/1999 Sun et al. ............................... 438/424
6,020,616 * 2/2000 Bothra et al. .......................... 257/381

* cited by examiner

Primary Examiner—Michael Trinh
(74) Attorney, Agent, or Firm—Blakely Sokoloff Taylor & Zafman

(57) ABSTRACT

A method for fabricating a mask comprises a first pattern in respective of active areas, and a second pattern in respective of dummy active areas. After removing the first pattern, the profiles of the dummy active areas are enlarged. The N-well boundary and the P-well boundary of the second pattern is respectively shielded to form a first composed pattern and a second composed pattern comprising the larger dummy active areas and a shielding pattern. The dummy active areas on the substrate are shielded by the patterns of the embodiment during the process of ion implantation. Thus the resistivity of the dummy active areas is increased, whereby the parasitic capacitance can be prevented from being too large and affecting the performance of the devices.

4 Claims, 5 Drawing Sheets

METHOD FOR FORMING A DUMMY ACTIVE PATTERN

BACKGROUND OF THE INVENTION

1. Field of Invention

The present invention relates to a method of forming a mask pattern for manufacturing a semiconductor device. More particularly, the present invention relates to a method of manufacturing a dummy active mask pattern, by which the active regions can be protected from ion implantation.

2. Description of Related Art

Shallow trench isolation (STI), is widely used in manufacturing an integrated circuit. Forming STI includes the steps of forming a trench on the substrate by the anisotropic dry etching and filling the trench with oxide to provide a device insulation area. Therefore, in the process of forming a complementary metal-oxide semiconductor (CMOS) with sub-micron dimensions, STI is a better and scaleable insulation structure, and can prevent a "bird's beak" encroachment in local oxidation. In a conventional method of forming STI, a dummy active pattern is usually formed to prevent a "dishing effect" from occurring on larger STI areas in the process of chemical mechanical polishing (CMP). However, the presence of the dummy active pattern still affects the performance of the semi-conductor devices.

FIGS. 1A to 1C show cross-sectional views of a conventional method in which a dummy active pattern is used to form the STI. As shown in FIG. 1A, after defining a photo-resist layer with a dummy active pattern (not shown in FIG. 1A) on a substrate 100, a plurality of dummy active areas 106 and shallow trenches 108 are formed thereon, and then an insulation layer 110 is deposited on the substrate 100, and the shallow trenches 108 are filled.

Then, as shown in FIG. 1B, the insulation layer 110 is polished by CMP until it is level with the substrate 100, whereby the shallow trenches 108a are formed. Then, a mask pattern (not shown in FIG. 1B) is used in for implanting ions into the substrate 100 to form an N-well 102 and a P-well 104. Then, as shown in FIG. 1C, a dielectric layer 112 is formed on the substrate 100 and a metal layer 114 is sequentially deposited for forming plugs.

In light of the foregoing, although the conventional method of using dummy active areas on the substrate provides a method of preventing the dishing effect while performing CMP on the shallow trench isolation areas, the existence of dummy active areas make the trench isolation so narrow that a parasitic capacitance is formed between metal interconnections and dummy active areas after doping with N-type ions or P-type ions. This is due to the ions being implanted into the dummy active areas. Therefore there is a need to provide a method to prevent parasitic capacitance due to the interaction between dummy active areas and the metal line.

SUMMARY OF THE INVENTION

Accordingly, the present invention provides a method for forming a mask pattern to prevent ions from being doped into the dummy active areas while forming a P-well or an N-well. Hence the dummy active mask pattern formed by the present invention can prevent ions from being implanted into dummy active areas after the dummy active areas are formed. This will increase the resistivity of the dummy active areas, decrease parasitic capacitance while the current is applied, and decrease the RC delay.

To achieve these and other advantages and in accordance with the purpose of the present invention, as embodied and broadly described herein, this invention provides a method of forming a dummy active pattern. First, a first pattern defining an N-well and P-well boundary and active areas, which are formed and distributed on the P-well and N-well, is provided on a mask. Then, a second pattern with a plurality of dummy active areas outside the areas of active areas are formed on the mask, wherein parts of the dummy active areas are distributed on the P-well and the other are on the N-well. Then, the first pattern is removed and the second pattern is reserved, wherein the second pattern is subsequently enlarged. Then, a third pattern that defines the P-well boundary and the N-well boundary is provided, wherein the P-well boundary of the third mask pattern and that of the first pattern are the same in size, but the N-well boundary on the third mask is shielded. The third pattern is used to expose the P-well boundary desired in the subsequent ion implantation process to allow the P-type ions being implanted to form the P-well. The enlarged second mask pattern overlaps with the third pattern which shielding the N-well and therefore, only the P-well of the substrate is implanted ions.

For the same reason, we provide a fourth pattern defining the N-well boundary and the P-well boundary, wherein the size of the N-well boundary is the same as that of the first pattern. However, the fourth pattern shields the P-well boundary and exposes the N-well boundary to let the N-type ions form the desired N-well in the subsequent ion implantation process. Then the fourth pattern composed with the enlarged second pattern. Thus the second composed pattern have similar functions with the first composed pattern.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
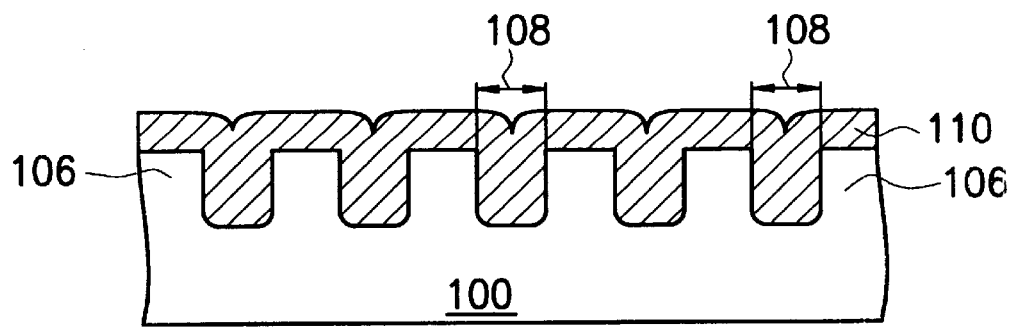
FIGS. 1A to 1C show schematic, cross-sectional views of conventional method of forming shallow trench isolation areas by using dummy active mask pattern.
Figure 1B:
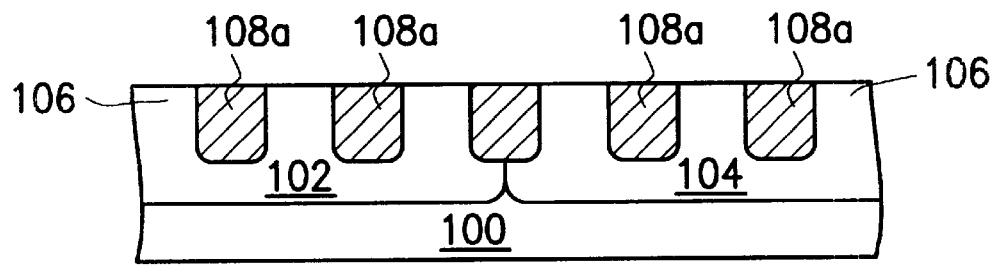
Figure 1C:
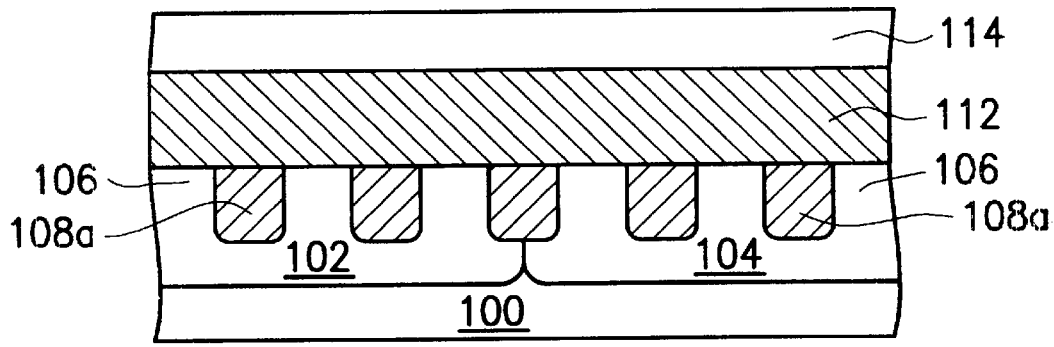

Reference will now be made in detail to the present preferred embodiments of the invention, examples of which are illustrated in the accompanying drawings. Wherever possible, the same reference numbers are used in the drawings and the description to refer to the same or like parts.

Figure 2A:
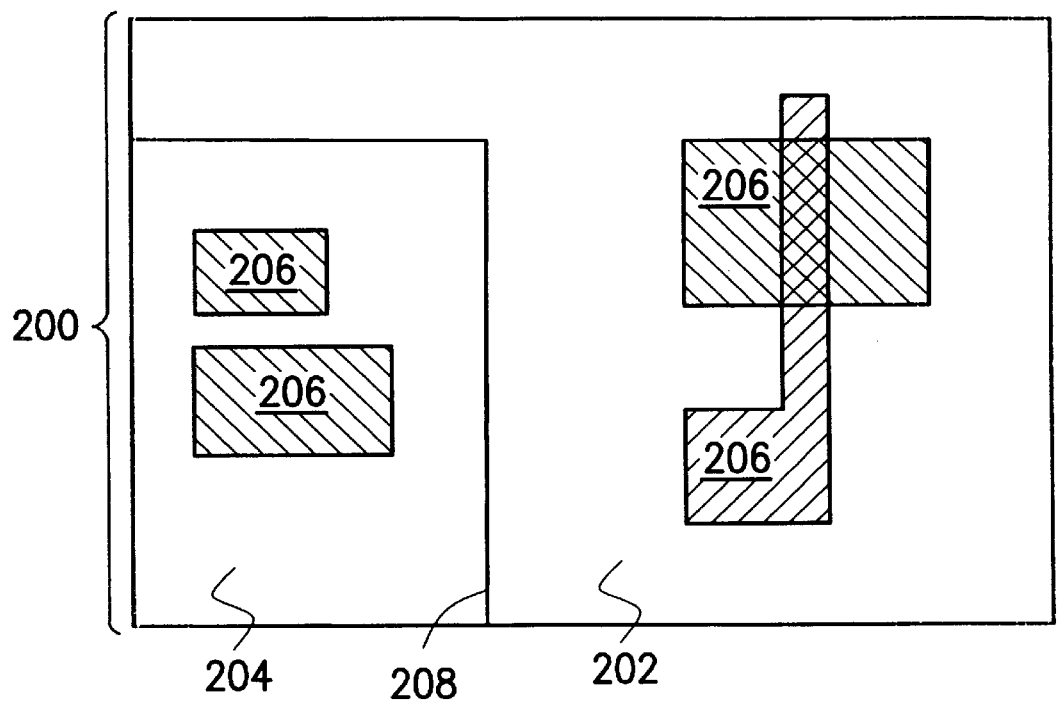
FIGS. 2A to 2G show schematic top views of forming dummy active pattern according to a preferred embodiment of the present invention.
Figure 2B:
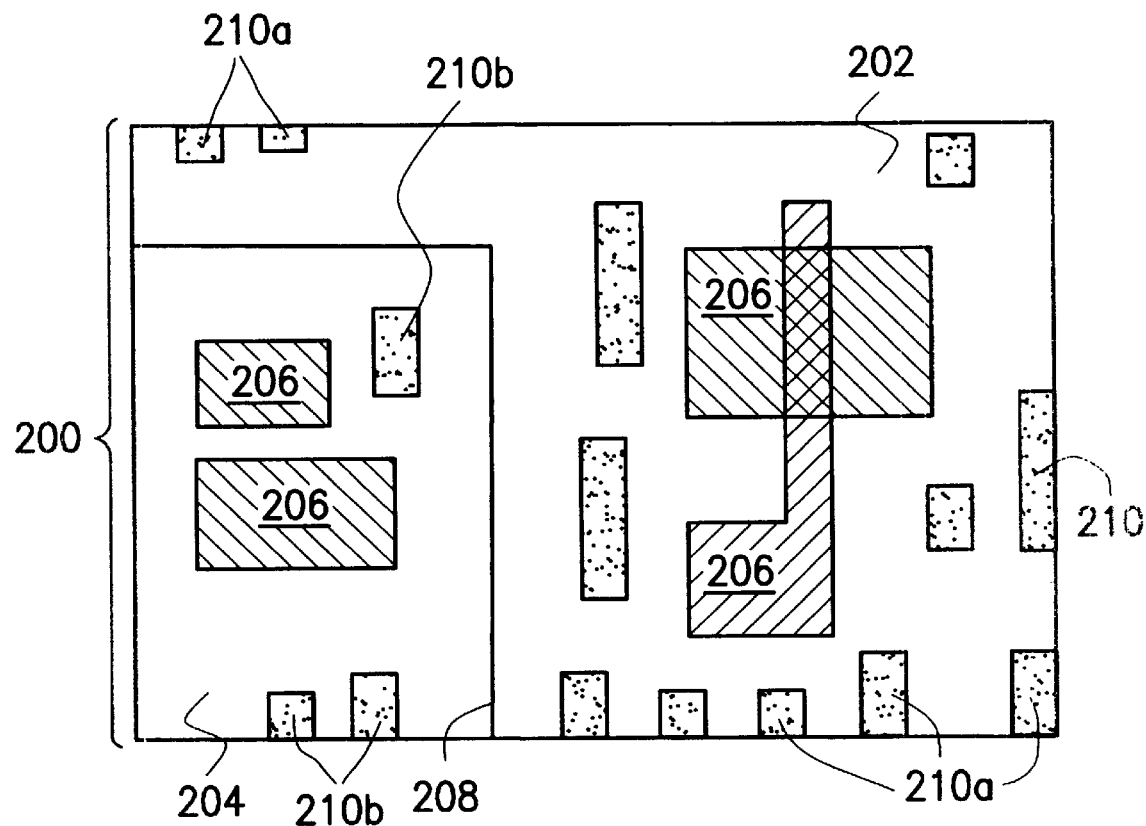

FIGS. 2A to 2G show schematic top views of forming dummy active pattern according to a preferred embodiment of the invention. Referring to FIG. 2A, a first pattern 200 comprises a P-well pattern 202 and an N-well pattern 204, and both the P-well pattern 202 and the N-well pattern 204 have a plurality of active pattern areas 206 distributed inside the first pattern 200. The P-well pattern 202 and the N-well pattern 204 are separated by the well boundary 208. As shown in FIG. 2B, a plurality of dummy active areas 210a formed on the P-well pattern 202 and a plurality of dummy active areas 210b formed on the N-well pattern 204 are all formed on the first pattern 200 to form the second pattern. The dummy active areas 210a and the dummy active areas 210b are spaced from the active areas 206.

Figure 2C:
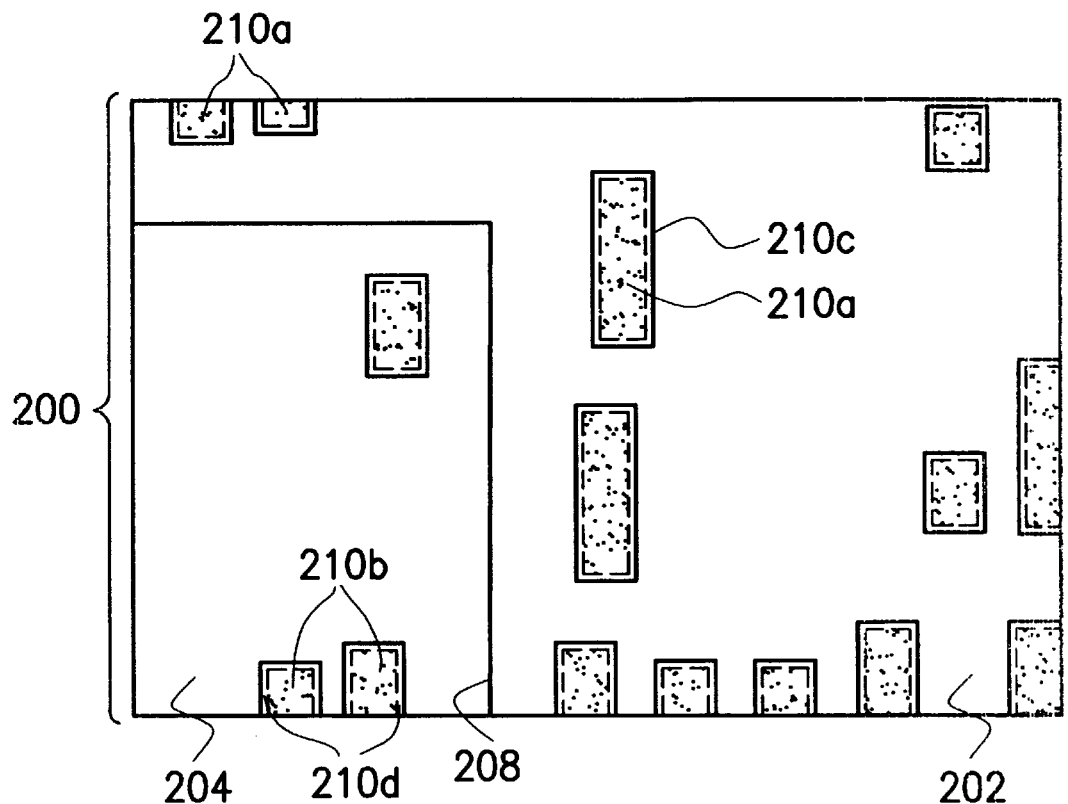
Figure 2D:
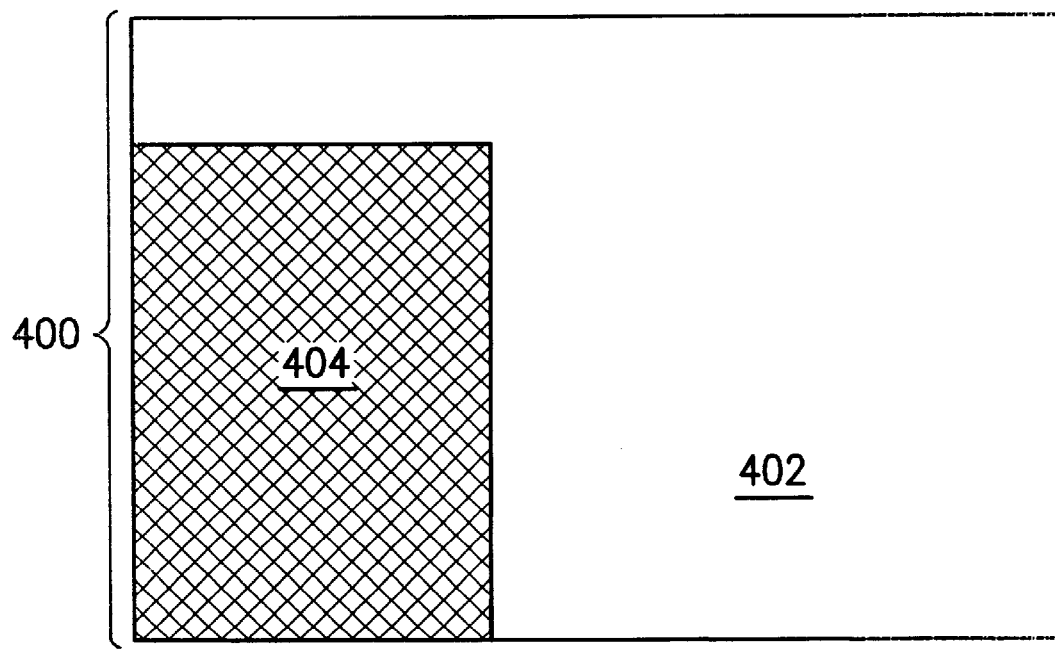
Figure 2E:
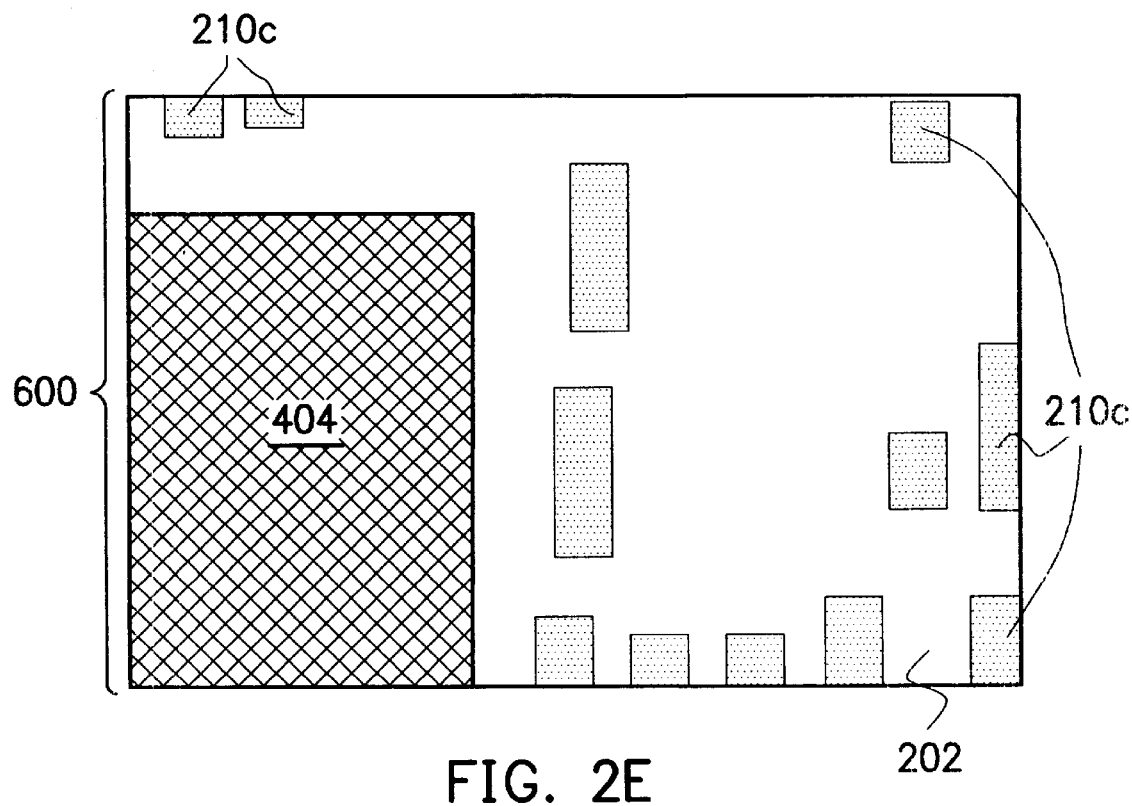

As shown in FIG. 2C, after removing the active areas 206 and enlarging the size of the profile of the dummy active areas 210a and 210b, the enlarged dummy active areas 210c of the P-well 202 and the enlarged dummy active areas 210d of the N-well 204 are formed. Then, as shown in FIG. 2D, a fourth pattern 400 comprising a shielding pattern 404 by which the N-well is shielded and an open pattern 402 by which the P-well boundary is exposed and the P-type ions can be implanted into the P-well is formed. The profile of the shielding mask pattern 404 and the N-well boundary 204 of the first mask pattern 200 are the same. As shown in FIG. 2E, then the third pattern 400 composes with the enlarged dummy active areas pattern 210c and 210d, whereby the P-type ions are implanted to form the P-well, forms the first composed pattern 600. The first composed pattern 600 therefore has a plurality of enlarged dummy active areas 210c and the shielding pattern 404 used in the subsequent photolithography process to shield the N-well boundary. Besides, the areas of the shielding pattern 404, which shield the enlarged dummy active areas 210d on the N-well pattern 204 in the sequential ion implantation process, the enlarged dummy active areas 210c on the fifth pattern 600 shield the dummy active areas 210a; thus the ions can be prevented from being implanted into the dummy active areas 210a.

Figure 2F:
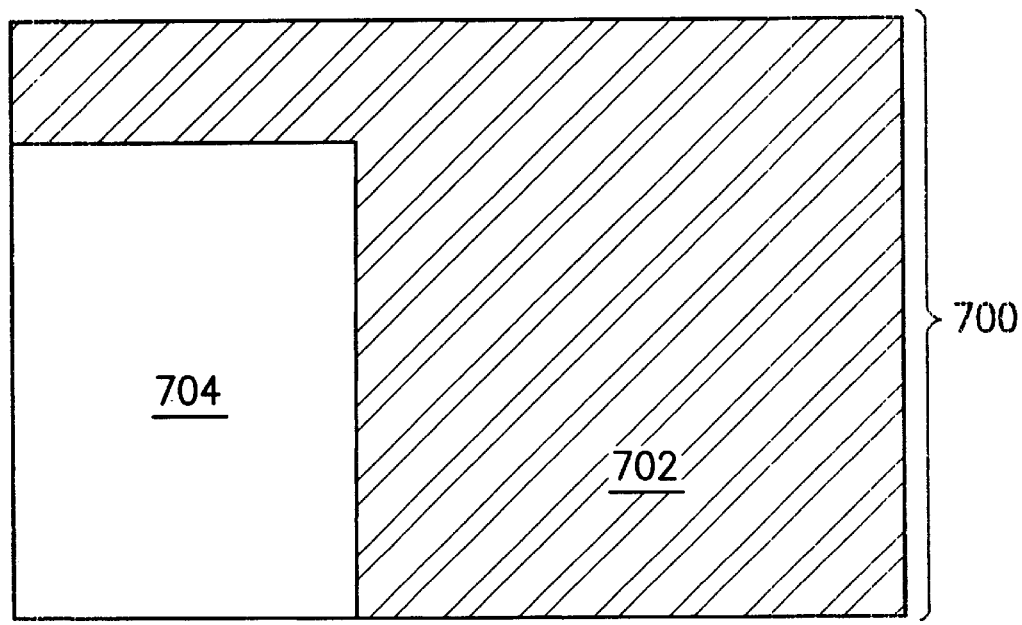
Figure 2G:
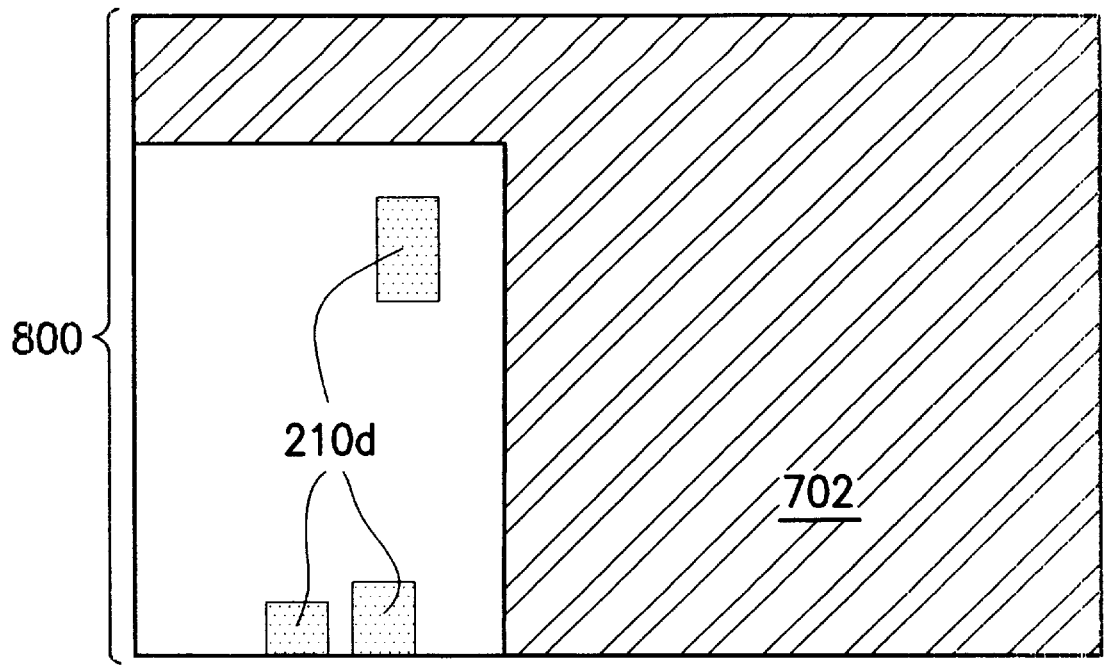

Accordingly, as shown in FIG. 2F, there is a fourth mask pattern 700 having a shielding pattern 702 used for shielding the P-well boundary in a sequential ion implantation process and an open pattern 704 used for implanting the N-type ions into the N-well boundary. The boundary between the shielding mask pattern 702 and the open pattern 704 is the same as the well boundary 208 of the first pattern 200. Then, as shown in FIG. 2G, the third pattern 400 comprising the enlarged dummy active areas 210c and 210d is overlapped with the sixth pattern 700 for implanting the N-type ions into the N-well boundary, by which a second composed pattern 800 is formed. The second composed pattern 800 has a plurality of enlarged dummy active areas 210d, and the shielding pattern 702 is used to shield the P-well in the sequential ion implantation process. The shielding pattern 702 shields the enlarged dummy active pattern 210c on the P-well boundary. Then, in the subsequent ion implantation process, the enlarged dummy active areas 210d on the second composed pattern 800 shield the dummy active areas 210b to prevent the ions from being implanted into the dummy active areas 210b.

Figure 3:
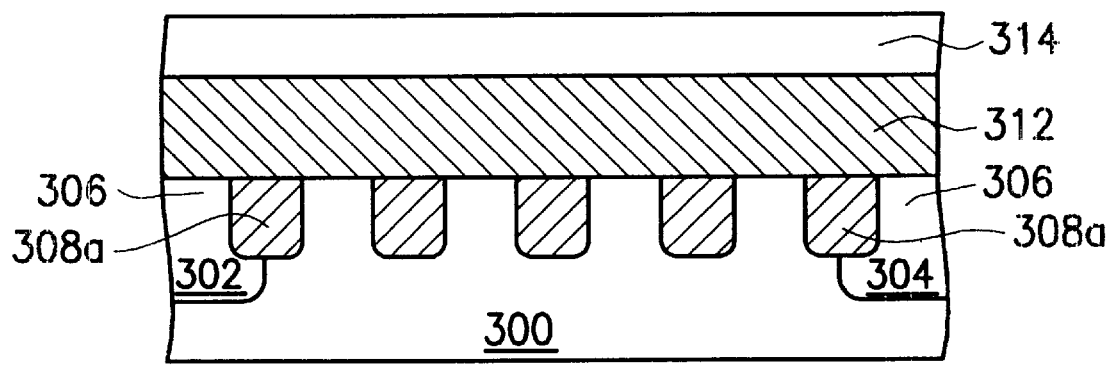
FIG. 3 shows a schematic, cross-sectional view of formed dummy active pattern according to the preferred embodiment as shown in FIGS. 2A to 2G.

FIG. 3 shows a cross-sectional view of the dummy active pattern formed according to the preferred embodiment as shown in FIGS. 2A to 2G. The enlarged dummy active areas pattern on the mask performed in the invention prevent ions from being implanted into the dummy active areas while implanting ions to form the N-well 302 or the P-well 304.

Thus the dummy active areas will have higher resistivity. This protects the semi-conductor device and metal line 314 from a larger parasitic capacitancelonger RC time delay, and longer the transferred signal speed.

It will be apparent to those skilled in the art that various modifications and variations can be made to the structure of the present invention without departing from the scope or spirit of the invention. In view of the foregoing, it is intended that the present invention shield modifications and variations of this invention provided they fall within the scope of the following claims and their equivalents.

What is claimed is:

1. A method of forming patterns on a mask for a semiconductor device, said semiconductor device having a substrate, comprising the steps of:

forming a first pattern on the mask defining an N-well area and a P-well area and active areas on the substrate;

forming a second pattern on the mask in respect to dummy active areas on the substrate;

removing the first pattern from the mask;

enlarging a size profile of the second pattern to form a third pattern;

obtaining a fourth pattern on the mask by adding a shielding N-well pattern with the third pattern in the P-well; and obtaining a fifth pattern on the mask by adding a shielding P-well pattern with the third pattern in the N-well.

2. The method according to claim 1, further comprising the steps of:

shielding the N-well boundary of the second pattern to form a first composed pattern.

3. The method according to claim 2, further comprising the steps of:

shielding the P-well boundary of the second pattern to form a second composed pattern.

4. An implantation method for manufacturing a semiconductor device, said semiconductor device having a substrate with an N-well area and a P-well area, comprising the steps of:

providing a mask with a first pattern in respect to a plurality of active areas on the substrate and a second pattern in respect to a plurality of dummy active areas on the substrate;

removing the first pattern from the mask;

enlarging a size profile of the second pattern on the mask to form the third pattern;

forming a fourth pattern on the mask to shield N-well area on the substrate, which composes with the third pattern in the P-well area on the mask, and implanting ions into the P-well area to form a P-well; and forming a fifth pattern on the mask to shield the P-well area on the substrate, which composes with the third pattern in the N-well area on the mask, and implanting ions into the N-well area to form an N-well.

* * * * *